(12) United States Patent
Goenke et al.

(10) Patent No.: US 7,156,279 B2
(45) Date of Patent: *Jan. 2, 2007

(54) SYSTEM AND METHOD FOR MOUNTING ELECTRONIC COMPONENTS ONTO FLEXIBLE SUBSTRATES

(75) Inventors: Lakhi N. Goenke, Ann Arbor, MI (US); Charles Frederick Schweitzer, Northville, MI (US); Lawrence Lernel Bullock, deceased, late of Detroit, MI (US); by Jason Bullock, legal representative, Detroit, MI (US); by Shona Bullock, legal representative, Detroit, MI (US); Mark D. Miller, Monroe, MI (US); Jay DeAvis Baker, Dearborn, MI (US); Karen Lee Chiles, Farmington, MI (US); Achyuta Achari, Canton, MI (US)

(73) Assignee: Visteon Global Technologie, Inc., Van Bureu Township, MI (US)

( * ) Notice: Subject to any disclaimer, the term of this patent is extended or adjusted under 35 U.S.C. 154(b) by 243 days.

This patent is subject to a terminal disclaimer.

(21) Appl. No.: 10/149,031

(22) PCT Filed: Oct. 3, 2001

(86) PCT No.: PCT/US01/31122

§ 371 (c)(1),
(2), (4) Date: Aug. 1, 2003

(87) PCT Pub. No.: WO02/28583

PCT Pub. Date: Apr. 11, 2002

(65) Prior Publication Data

US 2004/0094607 A1 May 20, 2004

Related U.S. Application Data

(60) Provisional application No. 60/237,650, filed on Oct. 3, 2000.

(51) Int. Cl.
*B23K 1/00* (2006.01)
(52) U.S. Cl. .......................... 228/46; 228/200; 228/222
(58) Field of Classification Search .................. 228/46, 228/248.1, 200, 234.1
See application file for complete search history.

(56) References Cited

U.S. PATENT DOCUMENTS

| 5,431,332 | A | 7/1995 | Kirby et al. |
| 5,785,233 | A * | 7/1998 | Nutter et al. ................. 228/46 |
| 5,898,992 | A | 5/1999 | Annable |
| 6,003,757 | A | 12/1999 | Beaumont et al. |
| 6,145,734 | A | 11/2000 | Taniguchi et al. |
| 6,186,392 | B1 | 2/2001 | Ball |
| 6,267,288 | B1 | 7/2001 | Chung |
| 6,283,358 | B1 | 9/2001 | Ball |
| 6,642,485 | B1 * | 11/2003 | Goenka et al. ............. 219/400 |

* cited by examiner

*Primary Examiner*—Jonathan Johnson
(74) *Attorney, Agent, or Firm*—Brinks Hofer Gilson & Lione

(57) ABSTRACT

A system and method for reflowing solder to interconnect a plurality of electronic components (24) to a substrate (12) is disclosed. The system includes an oven for preheating the substrate (12) and the plurality of electronic components (24) disposed thereon, a supplemental heat source disposed in the oven for providing additional heat energy to reflow the solder (72), a pallet (14) for supporting the substrate (12), wherein the pallet (14) has at least one internal cavity (40), and a phase-transition material (42) disposed within the cavity (40) for absorbing heat from the pallet (14).

17 Claims, 6 Drawing Sheets

SYSTEM AND METHOD FOR MOUNTING ELECTRONIC COMPONENTS ONTO FLEXIBLE SUBSTRATES

CROSS-REFERENCE TO PRIORITY APPLICATION

This application claims benefit of U.S. Provisional Application No. 60/237,650 filed Oct. 2, 2000.

TECHNICAL FIELD

The present invention relates to an apparatus and method for reflowing solder to electrically connect electronic components to a flexible substrate having a low softening temperature.

BACKGROUND OF THE INVENTION

It is well known in the art to mount electronic components to rigid and flexible printed circuit boards. Typically, solder paste is applied to conductor pad regions on the rigid or flexible substrate. Components are then placed with their terminals contacting the solder paste in the pad regions. The substrate is then exposed to relatively high temperatures to activate the solder paste which melts and then solidifies to bond and electrically connect the components onto the substrate. The flexible substrates are typically made from polyimide, which exhibits good stability when exposed to high temperatures. Many film materials, including polyesters, have not been used satisfactorily for surface mount components primarily because they exhibit inadequate heat resistance and dimensional stability when exposed to the temperatures required for solder reflow.

A technique for mounting components onto flexible polyester substrates with low softening temperatures is taught by Annable in U.S. Pat. No. 5,898,992. The flexible substrate is fixed to a carrier support member. A cover is placed over the substrate. The cover has openings corresponding to component locations and with the carrier forms a carrier assembly. Solder paste is applied to the conductor regions of the substrate having component pads. Electronic components are then placed on the substrate with their terminals in contact with the solder paste. The carrier assembly is then pre-heated in a reflow oven to a temperature below the melting point of the solder paste. The assembly is then subjected to a rapid rise in temperature utilizing a supplemental heat source such as a heated gas jet The cover shields the substrate from the high reflow temperatures and minimizes distortion of the flexible substrate during reflow.

While the prior art teaching achieve their intended purpose significant improvements are needed. For example, it would be desirable to eliminate the need for a special cover for shielding specific areas of the substrate from the heat generated by the gas jet.

BRIEF SUMMARY OF THE INVENTION

In an embodiment of the present invention a reflow pallet is provided for soldering electronic components onto a flexible substrate utilizing specialized cooling arrangements to cool the substrate during the reflow process. These cooling arrangements utilize a phase change material disposed within internal cavities in the pallet. The phase change material absorbs heat from the substrate during a phase transition, thereby maintaining a lowered substrate temperature during reflow. This prevents softening of the substrate during reflow, thereby preserving its dimensional stability.

In another embodiment the pallet includes an actuated array of thermoelectric coolers to cool the pallet. These thermoelectric coolers are actuated as necessary during the reflow process to cool the substrate and preserve its dimensional stability. In yet another embodiment passages in the pallet through which water, air, or other suitable fluid is directed to absorb heat from the pallet are provided. These passages keep the substrate cool during the solder reflow process. Thus, the present invention allows the solder reflow of components onto flexible substrates without the use of a cover to shield the substrate during the reflow process.

In still another embodiment the pallet and cover are made of a suitable conductive material with good thermal diffusivity, such as a heat resistant carbon fiber composite. Other materials for the pallet include a thin layer of copper backed with a glass-filled epoxy such as FR4.

Preferably, the circuit conductors on the substrate are copper. Selected regions of the conductors referred to as component pads are provided with a surface finish such as tin or immersion silver to enhance the ease of soldering to the pads. The spaces between the conductor regions of the substrate may be filled with electrically isolated regions of copper having the same thickness as the conductor regions. These copper areas further shield the substrate during reflow by selectively absorbing heat during the reflow process.

Components may be mounted on both the top and bottom sides of the substrate. For such a substrate, the reflow process is repeated for the second side. The pallet has appropriate cavities to accommodate the components on the first side of the substrate.

The flexible circuit may comprise more than two layers of circuit conductors, commonly referred to as multi-layer circuits. For these circuits, two or more layers of the substrate film are used and bonded together with a suitable adhesive to form four or more conductor layers.

Any convenient solder paste formulation may be used provided that it can be activated at a suitable temperature. In an embodiment of the present invention a suitable solder paste has a melting temperature of 183 degrees centigrade with a composition of 63 percent tin and 37 percent lead. Other solder paste compositions include lead-free solders that are alloys of tin, silver and copper, but exhibit higher melting temperatures of about 220 degrees centigrade.

In still another embodiment of the present invention a supplemental heat source used to activate the solder paste may be supplied by one or more jets of hot gas which are directed toward the exposed areas of the substrate. Suitably, the jet of hot gas extends transversely over the width of the substrate as it is conveyed past it on a pallet.

DETAILED DESCRIPTION OF THE INVENTION

Figure 1:
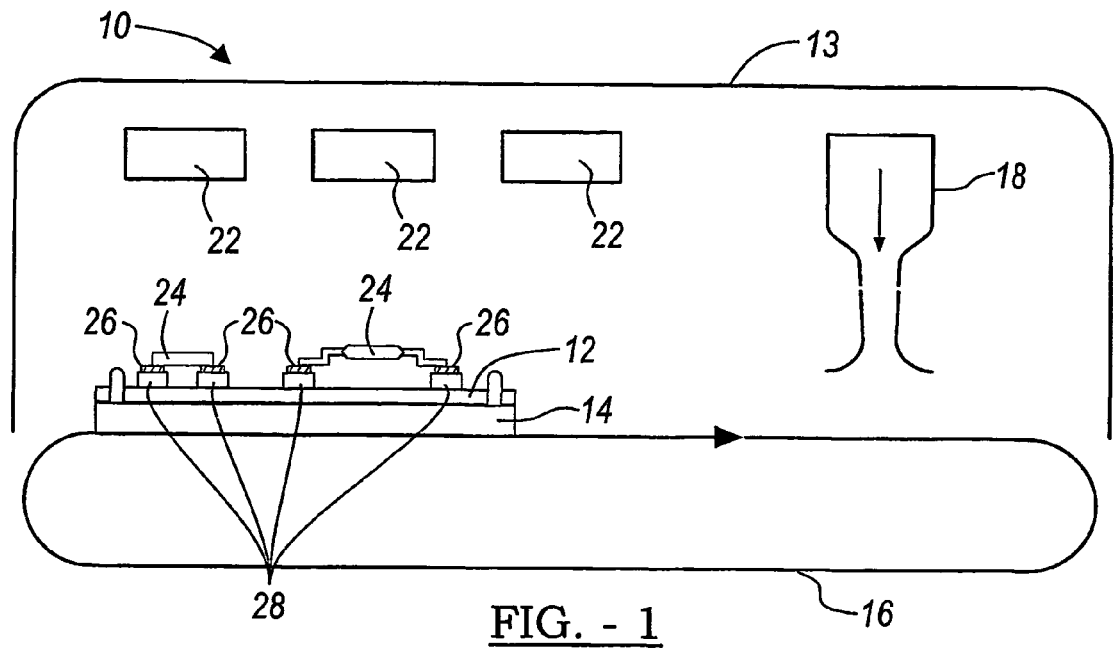
FIG. 1 is a schematic representation of an apparatus for reflowing solder to electrically connect electronic components to a flexible substrate mounted on a phase-transition pallet, in accordance with the present invention.

A system 10 for reflowing solder to electrically interconnect electronic components to a flexible or semi-flexible substrate 12 is illustrated in FIG. 1, in accordance with the present invention. Further, system 10 includes a pallet 20 that provides a means to mount circuit components on flexible substrate 12 without degrading the material properties of the substrate. System 10 additionally includes a reflow oven 13, a conveyor system 16, a gas nozzle 18 and a pallet 20. The reflow oven has a plurality of heaters 22 to pre-heat the substrate 12 to a desired temperature. Conveyor system 16 is configured in a conventional manner to cooperatively receive pallets 14 for movement through the reflow oven 13.

Pallet 14 is, preferably, a phase-transition pallet 14 for reflowing solder paste to interconnect electronic components 24 to flexible substrates 12, in accordance with the present invention. Phase-transition pallet 14 is configured to support substrate 12 and cooperates with conveyor system 16 to transport substrate 12 through oven 13. Oven 13's heaters 22 pre-heat substrate 12, and hot gas nozzle 18 provides supplemental heating. Solder paste 26 is printed on conductor pads 28 disposed on substrate 12 on which components 24 are placed.

Figure 2B:
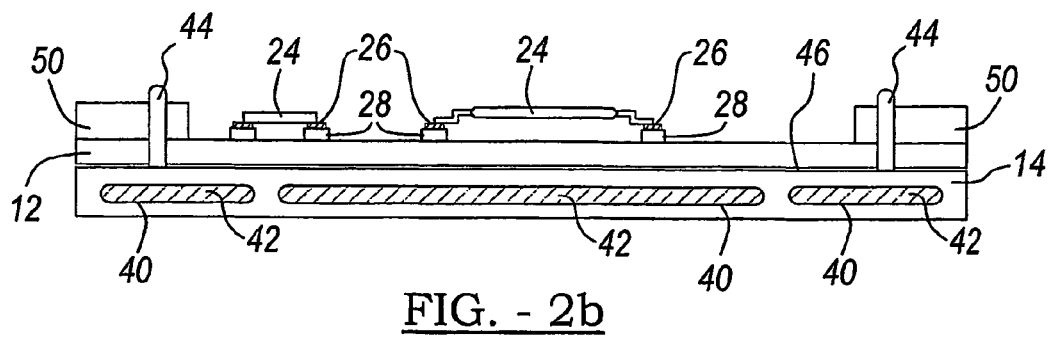
FIGS. 2a–2b is a cross-sectional and plan view of a preferred embodiment of the phase-transition pallet, in accordance with the present invention.
Figure 2A:
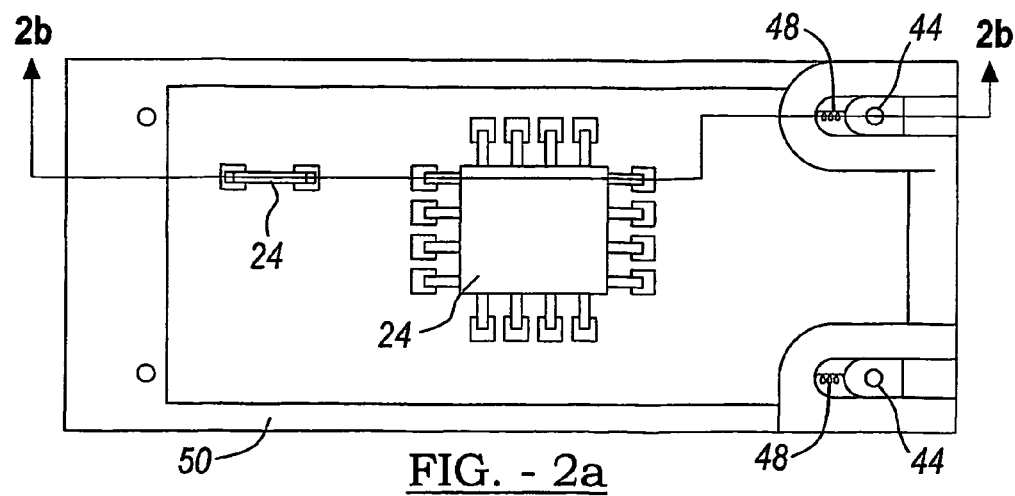
Figure 3A:
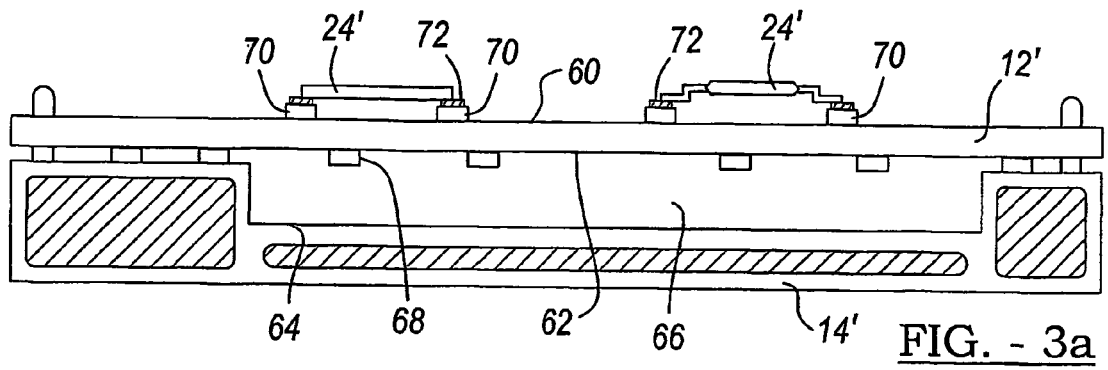
FIGS. 3a–3d are cross-sectional views of the phase-transition pallet having a flexible substrate on which electronic components are mounted on both exposed sides of the substrate, in accordance with the present invention.
Figure 3B:
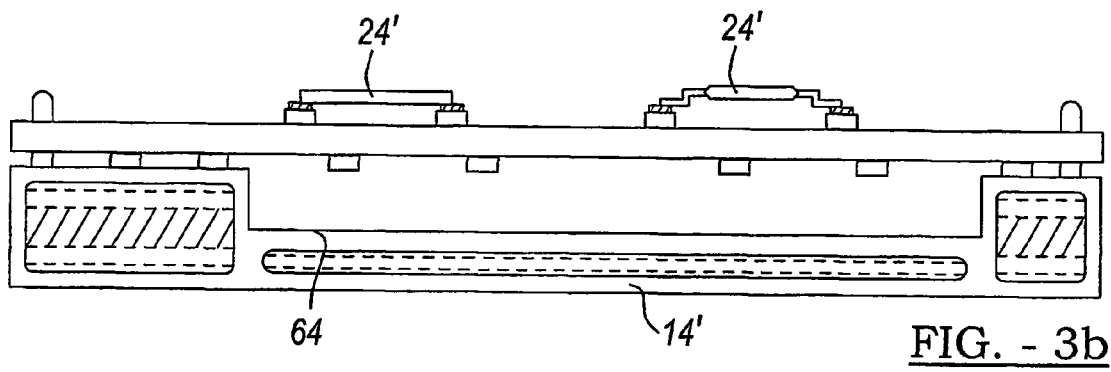
Figure 3C:
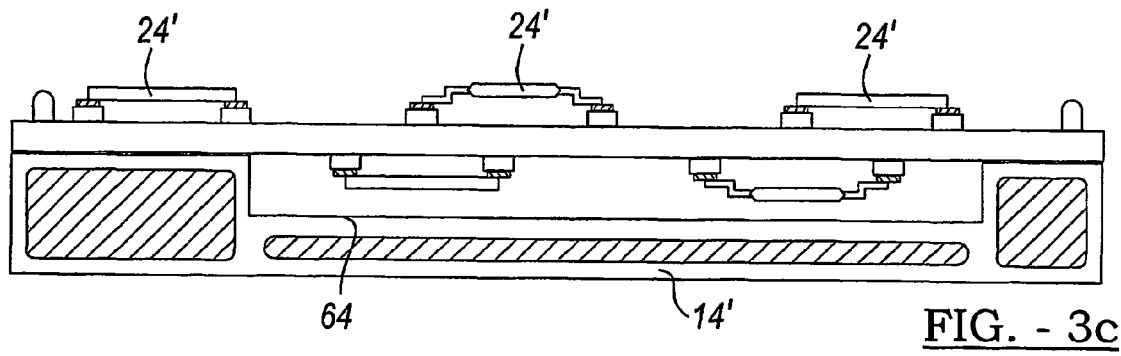
Figure 3D:
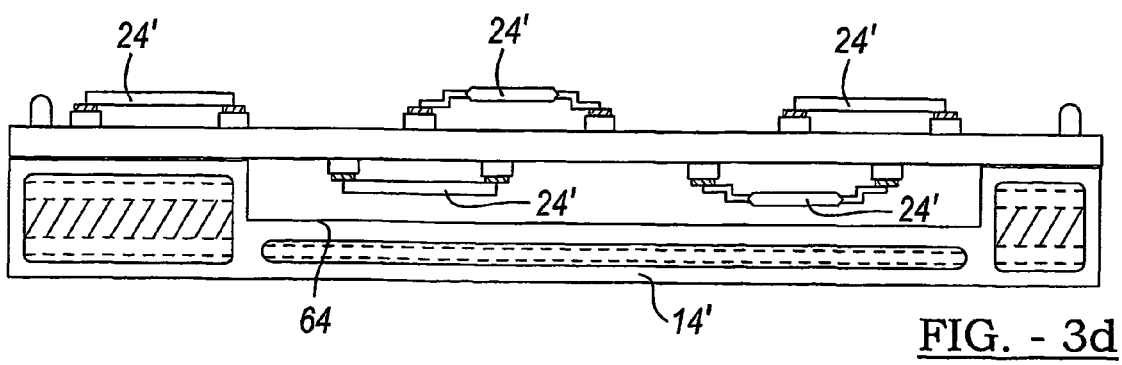

Referring now to FIGS. 2a–2b, an elevation and cross-sectional views of phase-transition pallet 14 are illustrated, in accordance with the present invention. As shown pallet 14 includes at least one internal cavity 40 having therein a phase-change material 42. Support pins 44 are provided on pallet 14 to hold substrate 12 flat or planar on a pallet surface 46. Pins 44 may be tensioned or loaded by springs 48 to provide a tensioning force on substrate 12. In an embodiment of the present invention, a picture frame 50 may be used to secure substrate 12 against pallet surface 46. Picture frame 50, as illustrated attaches to and secures the periphery of substrate 12 to hold the edges of substrate 12 against surface 46 of the pallet.

In another embodiment of the present invention, a phase-transition pallet 14' configured to accommodate a double-sided substrate 12 which electronic components 24' are populated on both sides 60, 62 of substrate 12', is illustrated. In several of the cross-sectional views, as shown in FIGS. 3a–3d, pallet 14' has at least one open cavity 64 to accommodate electronic components 24' that have been mounted on the first exposed surface 60 of substrate 12'. Open cavity 64 may be filled with a suitable foam 66, if necessary, to provide additional support for substrate 12'.

In a preferred embodiment of the present invention, substrate 12' is a polyester film having a thickness of 0.003 to 0.010 inches. Copper conductors 68 and solder pads 70 may be formed on both sides 60, 62 of the polyester substrate, as is well known in the art. A suitable solder mask (not shown) is applied over copper conductors 68 so that only the pad 70 areas on which solder paste 72 is to be printed are exposed. These pads 70 may have a suitable surface finish such as an organic surface finish to protect the pad surfaces from oxide formation. Other surface finishes such as immersion silver or electroplated tin may be used to enhance the solderability of components 24' to the pads.

Solder pastes 72 that have compositions containing lead, as well as solder pastes having lead-free compositions may be used. The solder pastes containing lead generally have a lower melting temperature of about 183° to 200° C., while lead-free solder compositions have melting temperatures of about 220° to 245° C.

In operation, as pallet 14 or 14' having substrate 12 or 12' affixed thereon is transported through the pre-heat zones in oven, the solder paste 72 is activated and gradually heated to just below its melting temperature. During this process, the phase-transition material 42 begins to absorb heat from the oven 13 as well as from the substrate 12 or 12', and thereby lowers the temperature of the substrate. The phase transition material 42 is selected having a melting point that is lower than the melting point of the solder paste 72. As the phase-transition material 42 begins to melt, the material begins to absorb an amount of heat or energy equal to the latent heat of the material. Consequently, the temperature of phase-change material 42 is held constant until the material is fully melted. Thus, the present invention significantly enhances the heat absorption properties of the pallet 14 or 14' and maintains a lowered substrate 12 or 12' temperature during reflow of the solder paste 72.

In a preferred embodiment of the present invention, phase-transition material 42 exhibits a melting temperature lower than that of solder 72, and may be comprised of conductive metals such as gallium, gallium alloys, or alloys of tin and lead. Other suitable phase transition materials include chloro-fluoro carbons and their compounds.

The supplemental heat created from gas nozzle 18 is utilized to provide a focused and concentrated heat source. Gas nozzle 18 provides heat to the exposed substrate surface for a short duration. The solder paste 26, conductor pads 28, and copper regions of substrate preferable absorb heat because of their high thermal diffusivity, while substrate 12 or 12' is maintained at a lower temperature by the pallet 14 or 14', which is held at a lower temperature by the phase-transition material 42. In this manner, softening and damage to substrate 12 or 12' during the reflow process is prevented.

After the exposed region of the substrate passes below gas nozzle 18, the temperature of the exposed electronic component 24 and substrate 12 or 12' rapidly falls so that the activated solder cools and solidifies. A reliable electrical connection between the conductors or pads 20 and components 24 or 24' is thus formed. During this process, the phase-transition material 42 also solidifies, so that pallet 14 or 14' is ready for reuse.

Figure 4A:
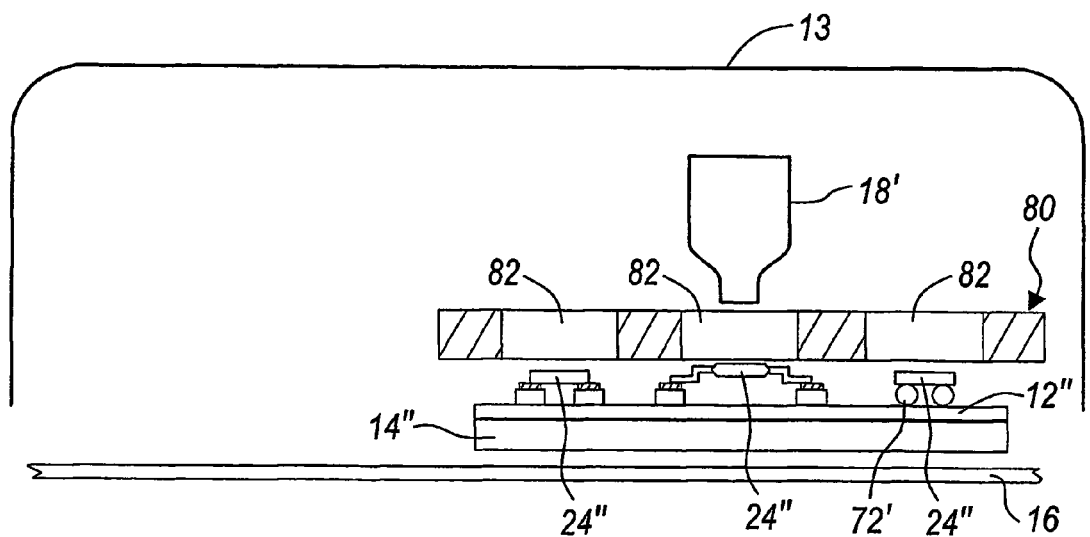
FIGS. 4a–4b is a schematic representation of a system for reflowing solder to electrically connect electronic components to a flexible substrate using a stencil, in accordance with the present invention.
Figure 4B:
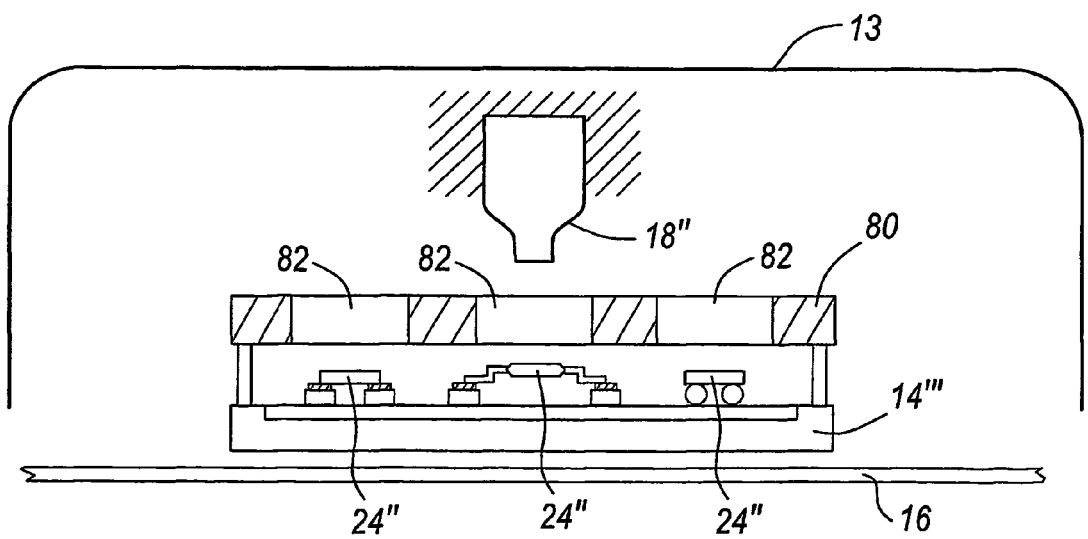

Referring now to FIGS. 4a and 4b, another embodiment of the present invention is illustrated wherein a stencil 80 is introduced between the gas nozzle 18' and the substrate 12 or 12'. The stencil 80 has a plurality of opening or apertures 82 disposed therein. The apertures 82 expose certain areas of the substrate 12" and/or components 24" to gas nozzle 18' to reflow the solder paste 72'. The stencil 80 also shields substrate 12" areas and/or components that are not to be exposed to the gas jet In this manner solder paste is melted in the appropriate areas and potential damage caused by heating the substrate to elevated temperatures is avoided. In another embodiment as shown in FIG. 4a, the pallet 14" and stencil 80 are held stationary while the gas nozzle traverses the stencil to selectively heat the substrate areas. In another embodiment, as shown in FIG. 4b, a hot gas nozzle 18" is held stationary while pallet 14''' and stencil 80 move below the gas nozzle 18". This embodiment would require multiple stencils to heat and reflow the desired areas of the substrate and electronic components.

Figure 5:
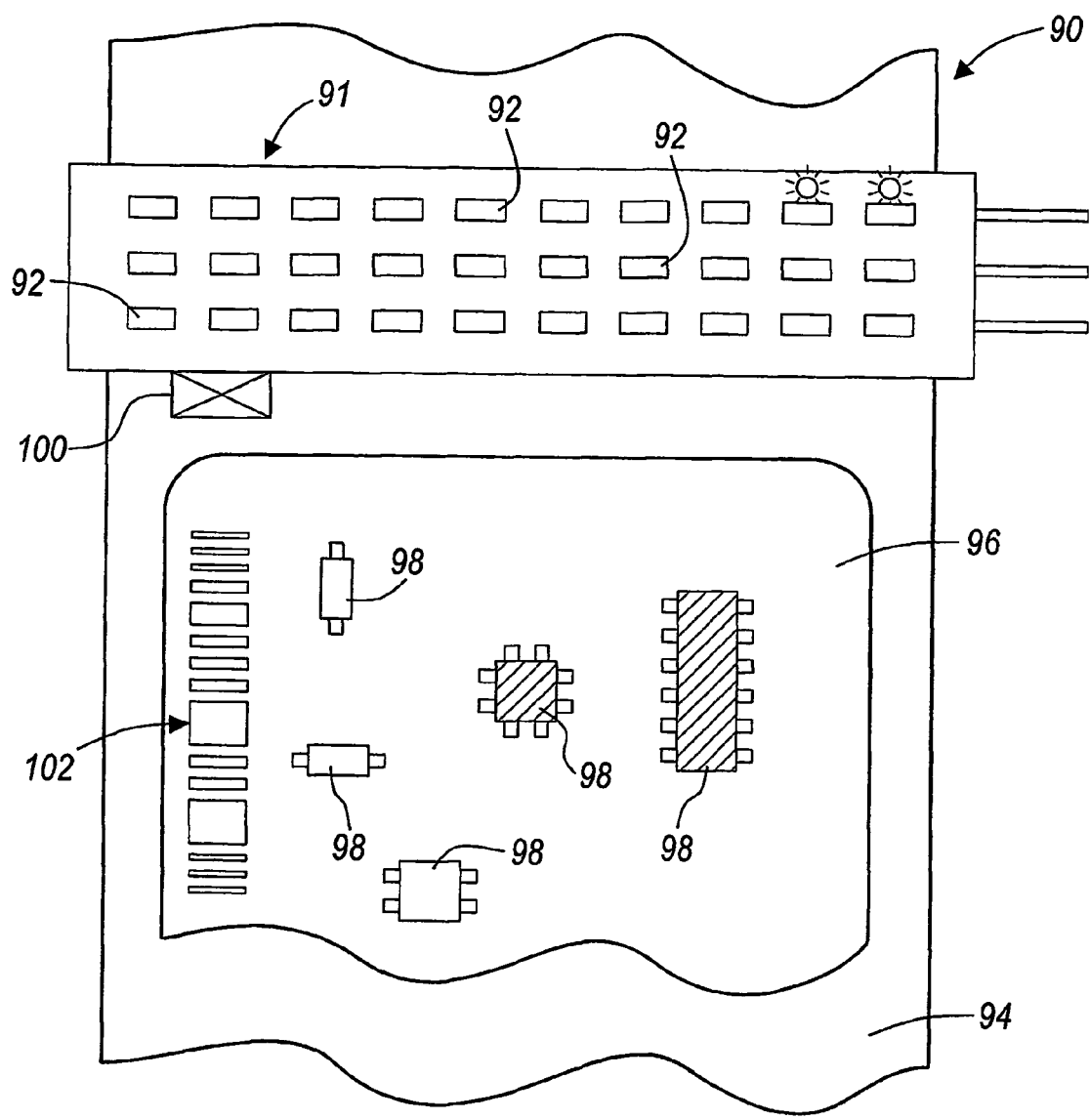
FIG. 5 is a schematic representation of a system for reflowing solder to electrically connect electronic components to a flexible substrate using an array of hot gas nozzles, in accordance with the present invention.

In yet another embodiment of the present invention, a system 90 for reflowing solder is illustrated in FIG. 5. The present embodiment contemplates system 90, having an array of gas nozzles 92 positioned above a conveyor system 94. The array of gas nozzles 92 are computer controlled and as such may be programmed to separately actuate for a defined period of time. The gas nozzles 92 are programmed to actuate and release high temperature gas on selected areas of a populated substrate 96 to reflow the solder paste as the components 98 pass underneath the array of nozzles 91. Preferably, a downward facing camera 100 or optical scanner is used to read a bar code 102 printed on substrate 96 to identify the substrate 96 and program the actuation of the array of gas nozzles 91. Array 91 may be constructed from a silicon micromachined structure and contain silicon micromachined valves. Other selective heating techniques such as soft beam may be used wit the gas nozzle array 91. Moreover, the present invention contemplates using different gas pressures in different gas nozzles in the array 91.

Figure 6:
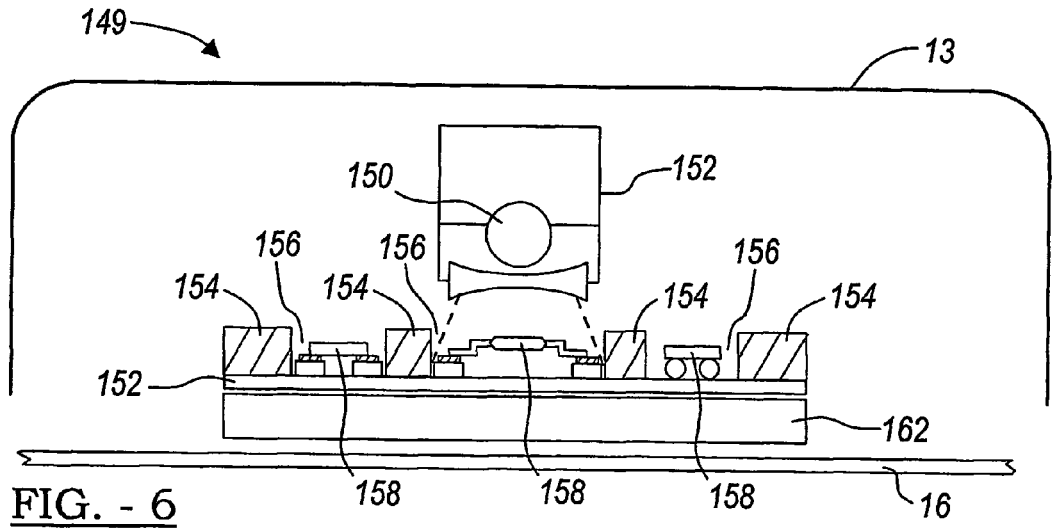
FIG. 6 is a schematic representation of a system for reflowing solder to electrically connect electronic components to a flexible substrate using an infra red light source, in accordance with the present invention.

In still another embodiment of the present invention, as shown in FIG. 6, a system 149 for reflowing solder using an infra-red light source 150 as a supplemental heat source 152 is illustrated. In the instant embodiment a substrate 152 is covered with a protective cover 154 that is impervious to infra-red radiation. Protective cover 154 has a plurality of apertures 156 for exposing the electronic components 158 to be soldered to substrate 152. The infrared light source 156 may include a plurality of infra red devices to produce a desired heating effect. Further, a Collimating lens 160 is placed between the infra red light 150 and the populated substrate 152 to focus the light directed toward the substrate. Once the protective cover 154 is in place the pallet 162/substrate 152/cover 154 assembly is placed on conveyor 16 and transported through reflow oven 13. The temperature of the oven 13 may be set at a temperature that does not damage flexible substrate 152. The additional heat energy required to reflow the solder paste, disposed between the electronic components 158 and the solder pads on the substrate is supplied by the infra red light source 150.

Figure 7A:
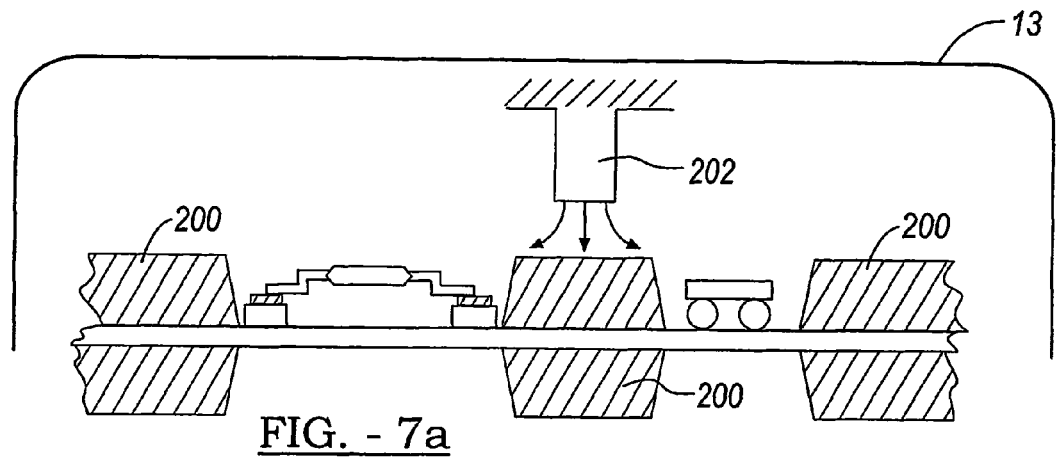
FIGS. 7a–7b is a schematic representation of a system for reflowing solder to electrically connect electronic components to a flexible substrate using a protective cover, in accordance with the present invention.
Figure 7B:
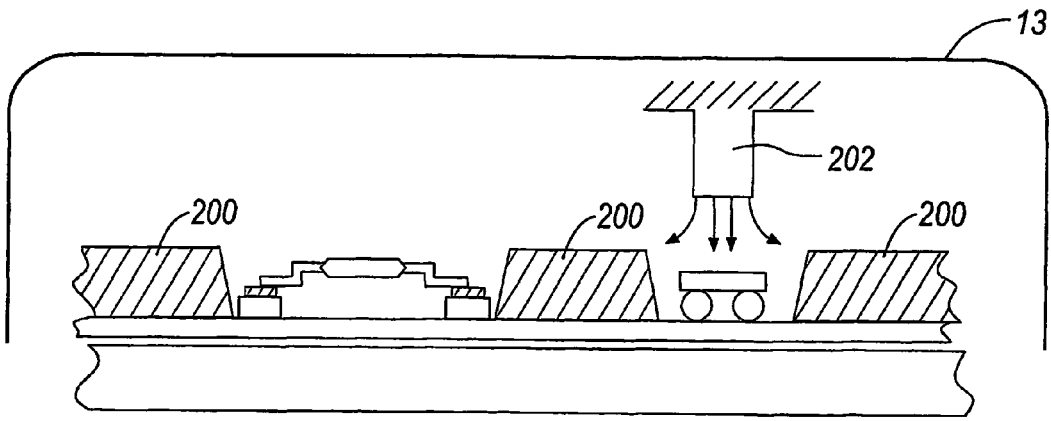

FIGS. 7a–7b illustrates a protective cover 200 for shielding portions of the substrate from hot gasses emanating from gas nozzle 202. In an embodiment of the present invention protective cover 200 is made from insulative materials such as FR4 material or aluminum or the like. This type of cover may combined with any of the previous embodiments, as appropriate.

Figure 8:
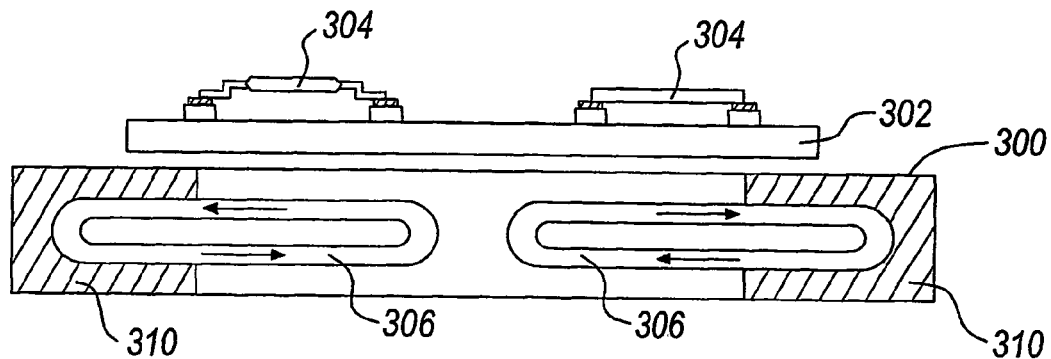
FIG. 8 is a schematic representation of a system for reflowing solder to electrically connect electronic components to a flexible substrate using a pallet having heat pipes, in accordance with the present invention.

FIG. 8 is a cross-sectional view through a pallet 300. Pallet 300 supports a flexible substrate 302 populated with electronic components 304. Pallet 300 includes a plurality of heat pipes 306 which draw heat away from substrate 302 to cooler regions of the pallet. Additionally, the heat pipes are in communication with phase transition regions 310 which contain phase transition material, as described previously. The heat pipes and phase transition regions 310 cooperate to cool the substrate 302 to insure the substrate is not damage by exposure to the supplement a heat source.

Figure 9A:
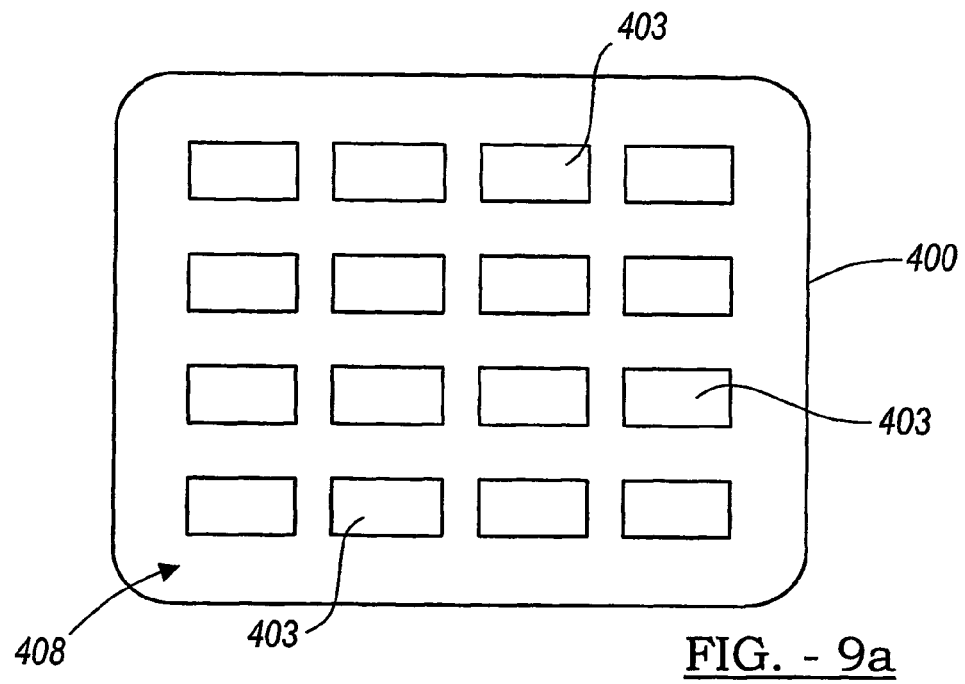
FIG. 9 is a schematic representation of a system for reflowing solder to electrically connect electronic components to a flexible substrate using a pallet having thermoelectric coolers, in accordance with the present invention.
Figure 9B:
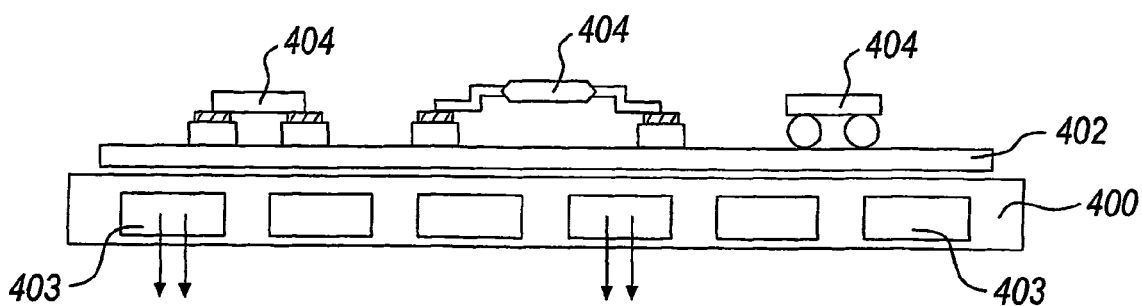

In another embodiment of the present invention, as shown in FIGS. 9a–9b, a pallet 400 is provided having thermoelectric coolers 403 to absorb heat away from substrate 402. As in the previous embodiments a supplemental heat source is applied to substrate 402 populated with electronic components 404 to reflow solder disposed there between. As shown in FIG. 9a, the present invention contemplates an array 408 of thermoelectric coolers 403 disposed in pallet 400. The array 408 may be independently actuated and controlled to provide localized cooling.

While the present invention has been particularly described in terms of the specific embodiments thereof, it will be understood that numerous variations of the invention are within the skill of the art and yet are within the teachings of the technology and the invention herein. Accordingly the present invention is to be broadly construed and limited only by scope ad spirit of the following claims.

The invention claimed is:

1. A system for reflowing solder to interconnect a plurality of electronic components to a substrate, the system comprising:
    an oven for preheating the substrate and the plurality of electronic components disposed thereon;
    a supplemental heat source disposed in the oven for providing additional heat energy to reflow the solder;
    a pallet for supporting the substrate, wherein the pallet has an internal cavity having a phase-transition material disposed therein for absorbing heat from the substrate; and
    a stencil positioned between the supplemental heat source and the electronic components to selectively direct heat from the supplemental heat source onto predefined portions of the substrate.

2. The system of claim 1 wherein the pallet has at least one tensioned pin to hold the substrate flat against the pallet.

3. The system of claim 1 further comprising a cover for covering portions of the substrate not to be exposed to the supplemental heat source.

4. The system of claim 1 wherein the phase-transition material is an alloy containing tin and lead.

5. The system of claim 1 wherein the phase-transition material is an alloy containing gallium.

6. The system of claim 1 wherein the supplemental heat source is a gas nozzle for directing hot gas onto the substrate.

7. The system of claim 1 further comprising a conveyor for transporting the pallet through the oven and under the supplemental heat source.

8. The system of claim 1 wherein the pallet further comprises an open cavity to accommodate electronic components mounted to both sides of the substrate.

9. The system of claim 1 wherein the open cavity further comprises a foam to provide support for the substrate.

10. The system of claim 1 further comprising a stencil positioned between the supplemental heat source and the electronic components to direct hot gas onto portions of the substrate.

11. The system of claim 1 wherein the supplemental heat source further comprises an array of hot gas nozzles, wherein the nozzles are independently actuatable and controllable to reflow the solder.

12. The system of claim 1 wherein the supplemental heat source is an infra red light source.

13. The system of claim 12 wherein the infra red light source further comprises a collimating lens for directing the infra red light onto the electronic components.

14. The system of claim 1 wherein the pallet further comprises at least one thermoelectric cooler for absorbing heat from the substrate.

15. The system of claim 1 wherein the pallet further comprises at least one heat pipe for absorbing heat from the substrate.

16. The system of claim 1 wherein the pallet has at least one internal cavity.

17. The system of claim 16 further comprising a phase-transition material disposed within the cavity for absorbing heat from the pallet.

* * * * *